(12) United States Patent
Jolin et al.

(10) Patent No.: US 6,535,411 B2
(45) Date of Patent: Mar. 18, 2003

(54) MEMORY MODULE AND COMPUTER SYSTEM COMPRISING A MEMORY MODULE

(75) Inventors: Edward M. Jolin, Folsom, CA (US); Julius Delino, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/747,936

(22) Filed: Dec. 27, 2000

(65) Prior Publication Data

US 2002/0121920 A1 Sep. 5, 2002

(51) Int. Cl.⁷ .................................................. G11C 5/02
(52) U.S. Cl. .............................. 365/52; 356/51; 356/233
(58) Field of Search .............................. 365/52, 51, 63, 365/233; 713/320; 702/117; 345/520; 714/42; 711/171

(56) References Cited

U.S. PATENT DOCUMENTS

| | | | | |
|---|---|---|---|---|
| 5,856,937 A | * | 1/1999 | Chu et al. | 365/51 |
| 6,034,878 A | | 3/2000 | Osaka et al. | 365/52 |
| 6,061,263 A | | 6/2000 | Boaz et al. | 365/51 |
| 6,226,729 B1 | * | 5/2001 | Stevens et al. | 711/166 |
| 6,230,274 B1 | | 5/2001 | Stevens et al. | 713/320 |
| 6,285,962 B1 | * | 9/2001 | Hunter | 702/117 |
| 6,288,729 B1 | * | 9/2001 | Laksono et al. | 345/520 |
| 6,292,911 B1 | * | 9/2001 | Swanson | 714/715 |
| 6,324,485 B1 | * | 11/2001 | Ellis | 702/117 |

FOREIGN PATENT DOCUMENTS

JP 565003 A2 10/1993 .......... G11C/11/56

* cited by examiner

Primary Examiner—David Lam
(74) Attorney, Agent, or Firm—Antonelli, Terry, Stout & Kraus, LLP

(57) ABSTRACT

A memory module has one or more memory devices, a clock generator providing clocking signals, and a clocking topology providing the clocking signals to the memory devices(s).

17 Claims, 9 Drawing Sheets

MEMORY MODULE AND COMPUTER SYSTEM COMPRISING A MEMORY MODULE

BACKGROUND

1. Field of the Invention

This invention relates generally to memory modules. In particular, the present invention relates to a memory module having its own clock generator.

2. Description of the Related Art

Some processing systems or functions in processing systems may have stringent memory processing requirements and thus utilize a type of memory module which is well suited to those processing requirements. One type of memory module specifically designed to have higher operating characteristics is a Rambus In-line Memory Module ("RIMM"), available for license from Rambus, Inc. of Mountain View, Calif. However, a RIMM has stringent interface and clocking signal requirements. Such requirements generally make the motherboards and other devices which support and interface with RIMMs more expensive than devices which support and interface with other types of memory modules.

FIG. 1 illustrates a conventional installation of a plurality of RIMM™ memory modules. As shown, they are mounted on a number of packaging units 102-1, 102-2, etc., electrically coupled in daisy chain fashion to memory interface 104 via Rambus channel 103. RIMMs 102-1, etc. obviously differ from DIMMs insofar as they have a plurality of Rambus Dynamic Random Access Memory "RDRAM" ™ 101-1 rather than DRAM, but they also conventionally require two pins for every one of the signals, including clocking signals, on Rambus channel 103 so that they can be coupled in sequence in daisy chain fashion as shown in FIG. 1.

The daisy chain arrangement of RIMMs 102-1, etc., provides electrical performance advantages. But it also results in a different form factor (size, etc.) and clocking signal requirements. These clocking signal requirements necessitate that a Direct Rambus Clock Generator (DRCG) 105 (and all discrete components associated with DRCG 105) and clock termination topology 106 must be provided on motherboard 100. (Although FIG. 1 shows DRCG 105 on a motherboard, it may also be installed on another board even though only mother board 100 is discussed herein.) DRCG 105 and termination 106 require a significant amount of board space and thus impose significant layout constraints on mother board 100. In addition, because the signals must be terminated on motherboard 100, all the clock signals must return from each one of RIMMs 102-1, etc. to motherboard 100, thereby requiring two pins for every clocking signal on each one of RIMMs 102-1, etc.

BRIEF SUMMARY

The present invention is directed to a memory module having one or more memory devices, a clock generator providing clocking signals, and a clocking topology connecting the clocking signals to the memory device(s).

DETAILED DESCRIPTION

An example embodiment of the invention is a Rambus In-line Memory Module (RIMM) adapted for use as a graphics memory controlled by a graphics controller integrated in the chipset of a personal computer. However, such use of a Rambus memory module according to the invention is merely exemplary. Various embodiments of the invention may of course be used in systems other than computers and a Rambus memory module according to the invention need not be used as graphics memory controlled by a graphics controller.

Figure 1:
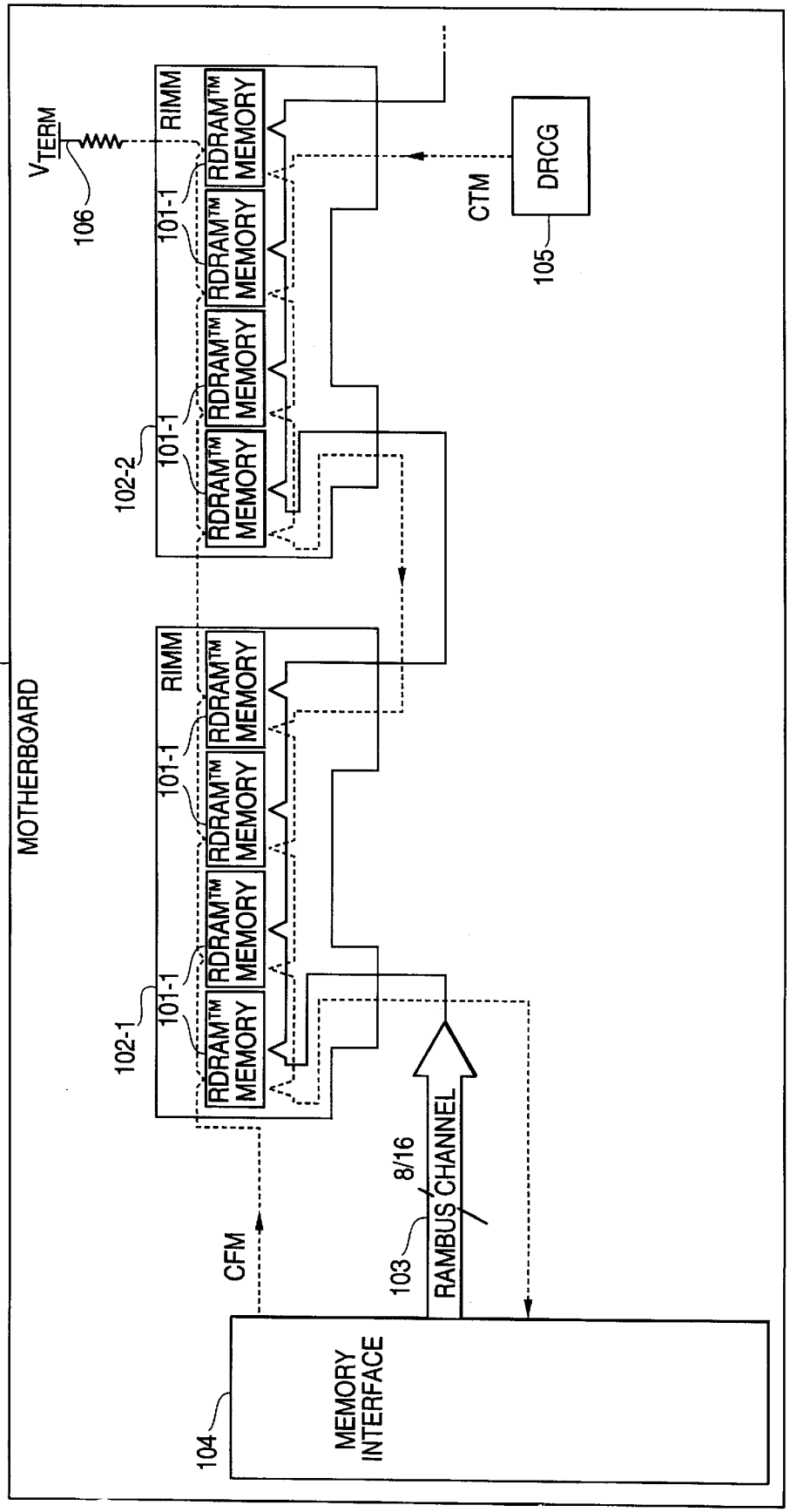
FIG. 1 is a generalized block diagram illustrating a conventional RIMM™ installation in a computer device.

As shown in FIG. 1, the DRCG, all discrete components associated with the DRCG, and the clock termination topology is conventionally placed on the motherboard, requiring a significant amount of board space. In addition, because the signals must be terminated on the motherboard, all the clock signals must return from the RIMM module(s) to the motherboard, thereby requiring two pins for every clocking signal.

As shown in prior art FIG. 1, RSL clocks (such as CTM) are routed from DRCG 105 to the right side of RIMM 102-2, exit the left side of RIMM 102-2, travel to RIMM 102-1 and to memory interface 104 (preferably, a memory controller hub in a chipset connected in turn to the processor of a computer system) and back (as a CFM signal), and then exit RIMM 102-2 on the right. This implementation requires 8 spins on each RIMM for the clock topology.

Figure 2:
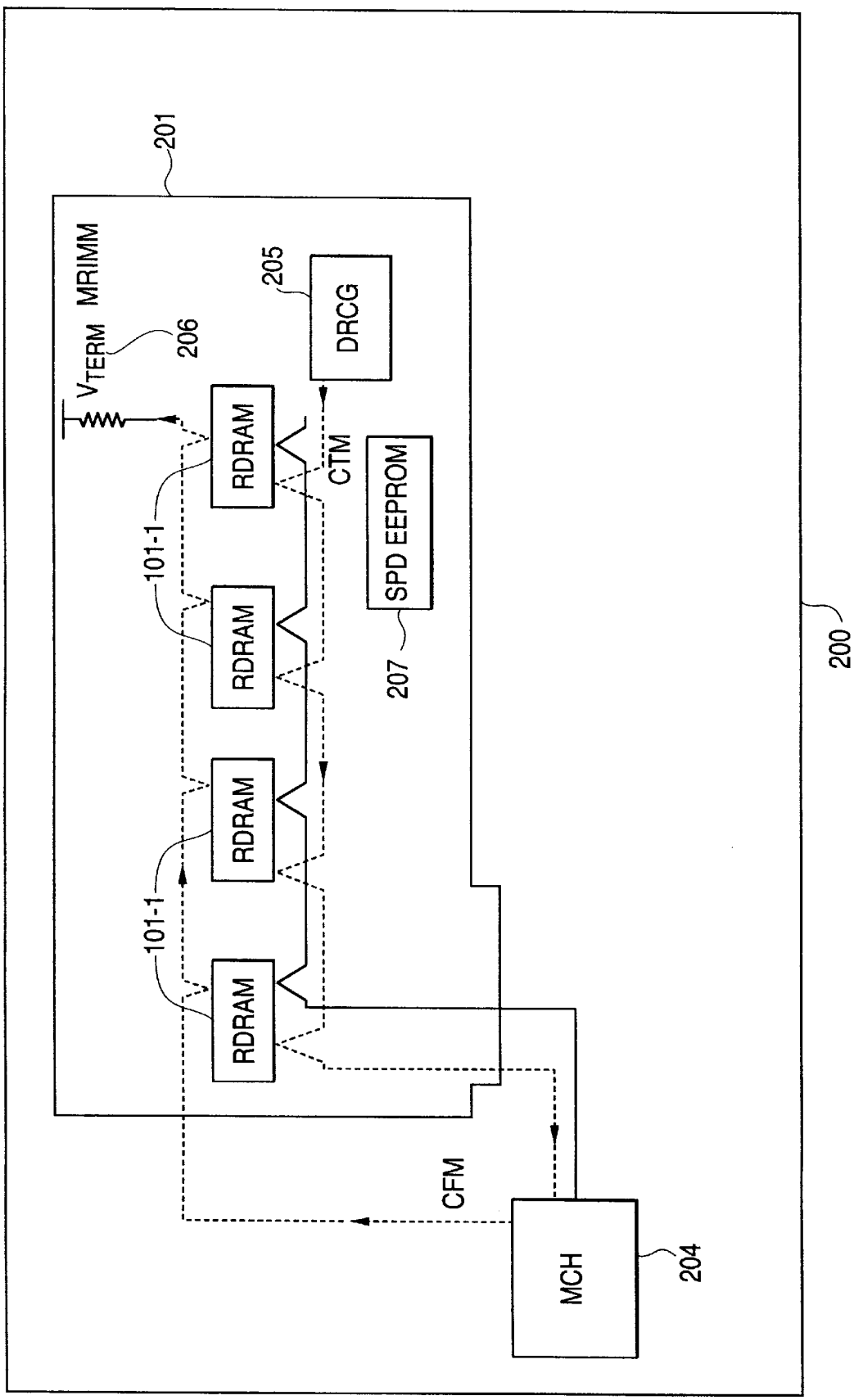
FIG. 2 is a block diagram illustrating a Miniature Rambus In-line Memory Module (MRIMM) according to an example embodiment of the invention.

The example embodiment of the invention removes layout constraints imposed by having DRCG 105 on a motherboard. FIG. 2 shows the example embodiment, where DRCG 105 and its associated components are moved to the Rambus memory module 201, so that only 4 pins (a total of 2 differential pairs) are required for the RSL clock signals, and instead of exiting Rambus memory module 201, the clock signals are terminated immediately on the memory module. Direct Rambus Clock Generator (DRCG) 205 in FIG. 2 provides the differential clock and the necessary termination of Rambus Signaling Level (RSL) clocks. Although four RDRAM memory devices 101-1 are shown in FIG. 2, only one, two or three (or any other number of) RDRAM memory devices may be located on the memory module. A termination 206 and a Serial Presence Detect (SPD) electrically eraseable programmable read-only memory (EEPROM) 207 is also provided.

Figure 3:
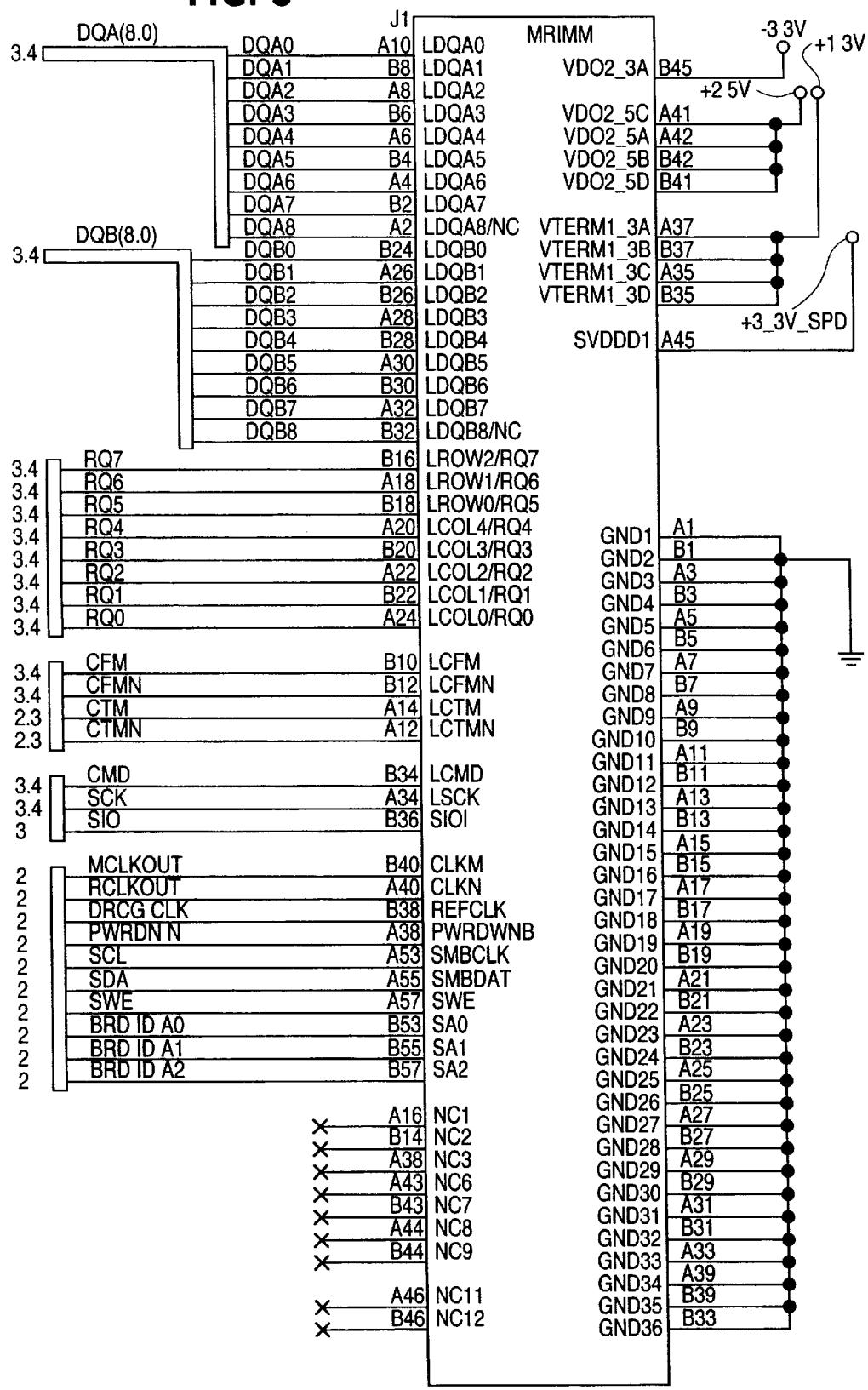
FIG. 3 is a schematic diagram illustrating the external connections of the MRIMM shown in FIG. 2.
Figure 6A:
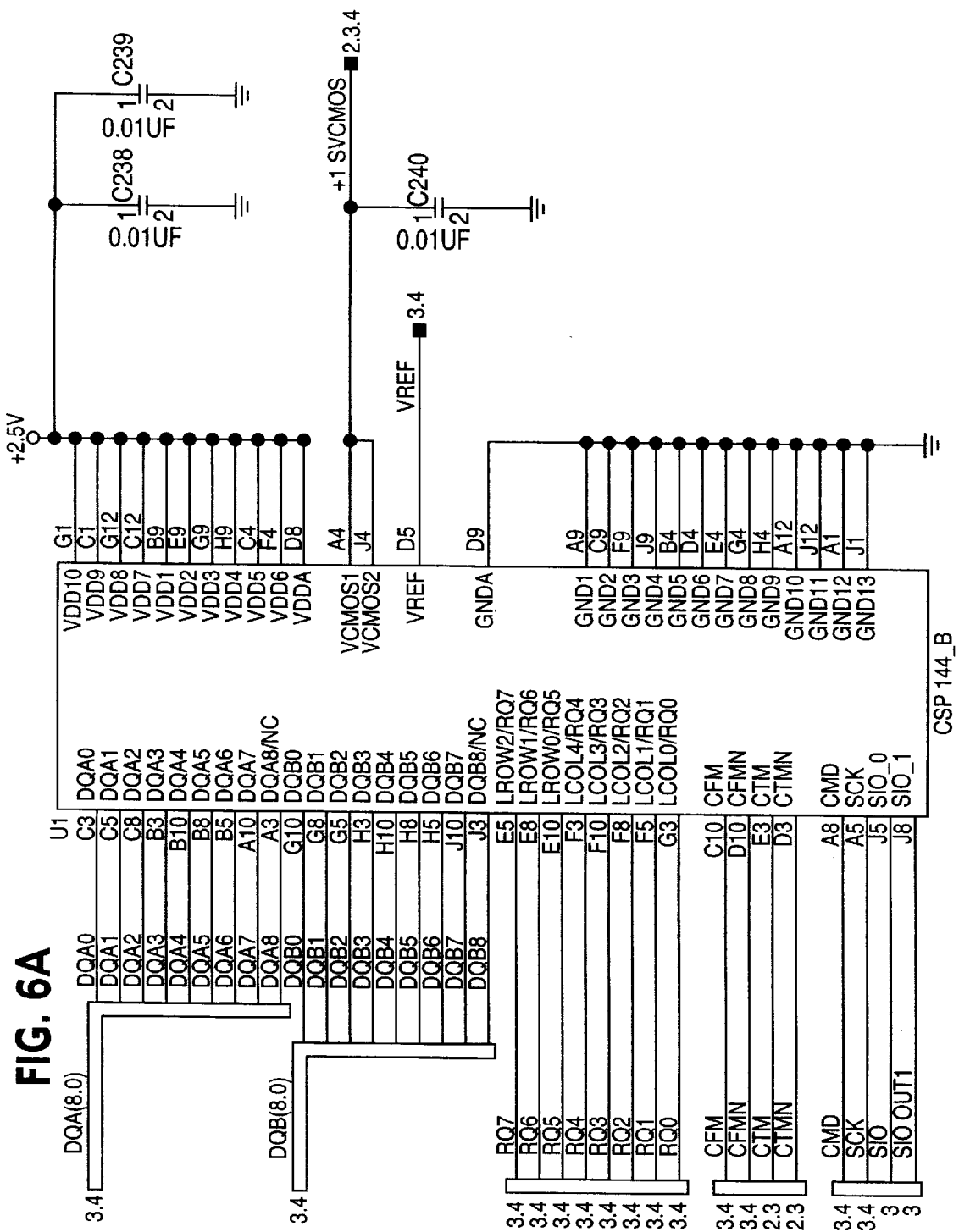
FIGS. 6A and 6B are schematic diagrams illustrating the connections of the memory devices of the RIMM in the example embodiment of the invention shown in FIG. 2.
Figure 6B:
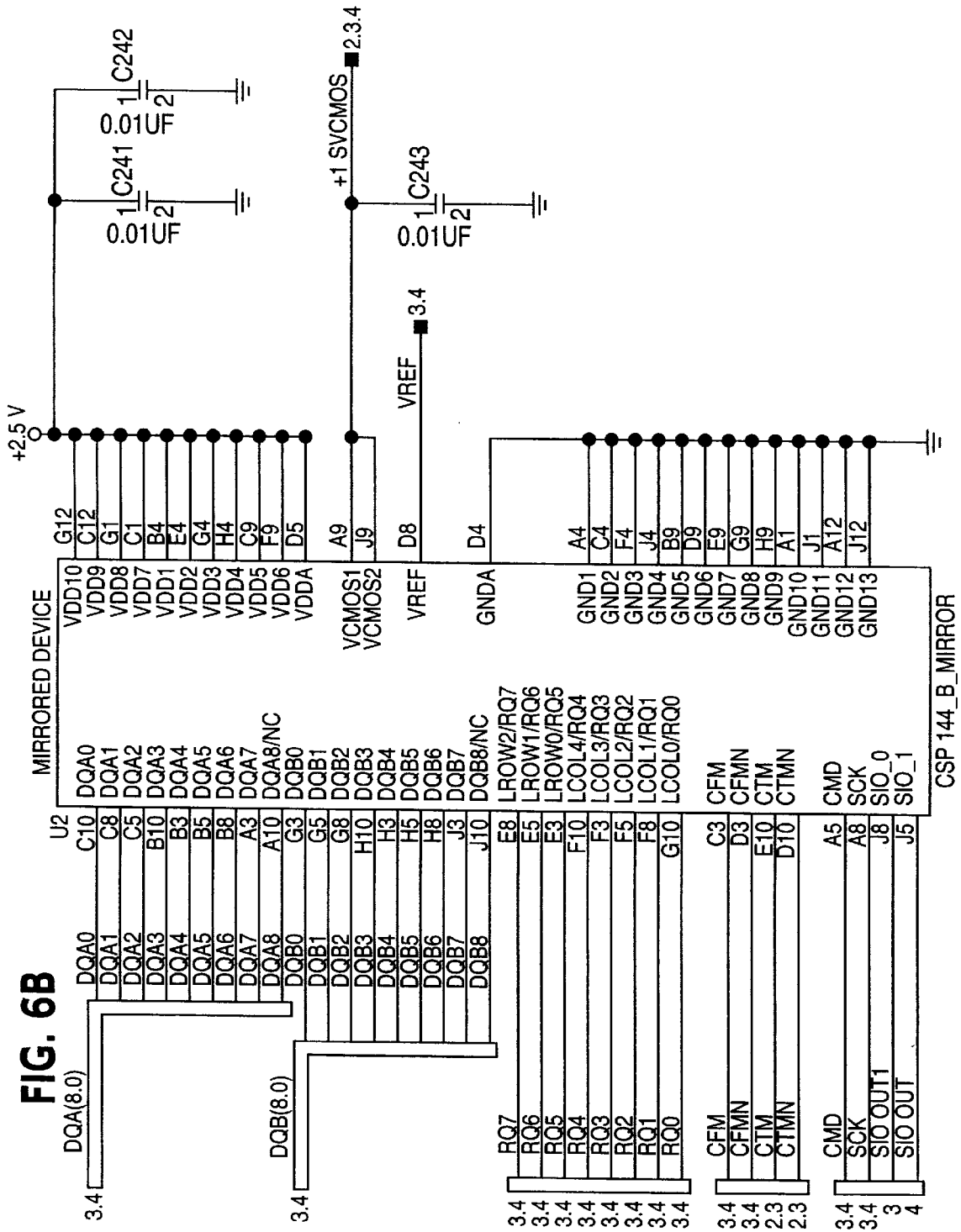
Figure 7A:
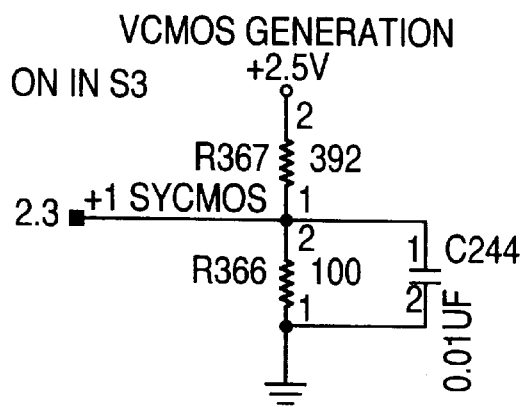
FIGS. 7A—7F are schematic diagrams of the termination circuits in the example embodiment of the invention shown in FIG. 2.
Figure 7B:
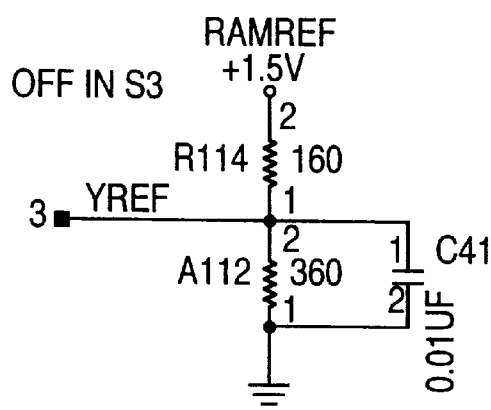
Figure 7C:
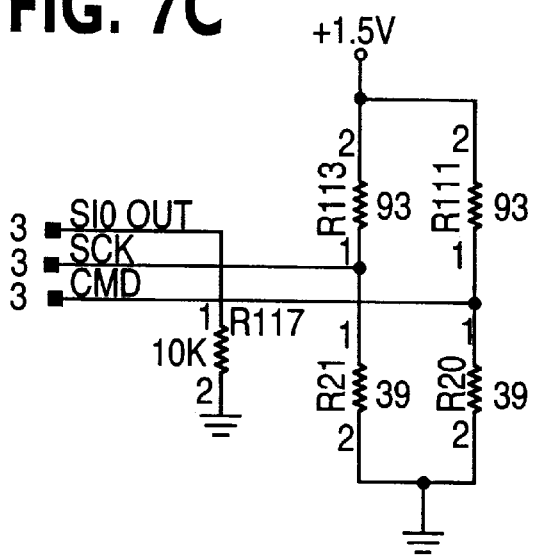
Figure 7D:
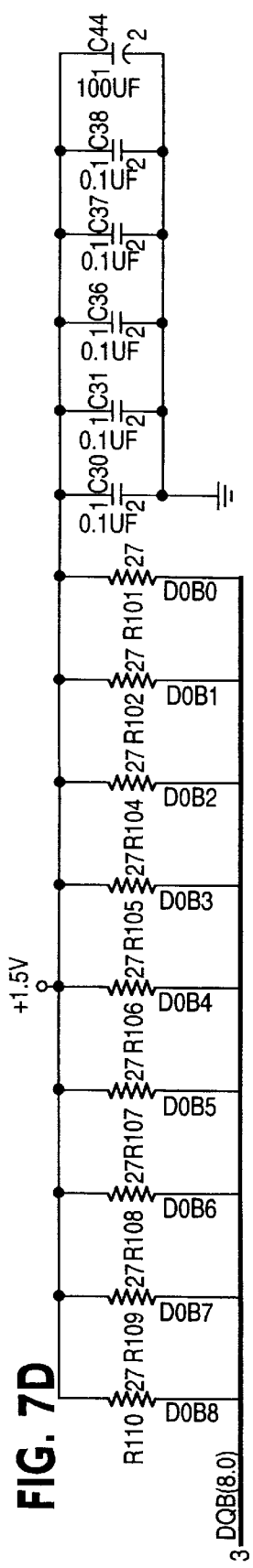
Figure 7E:
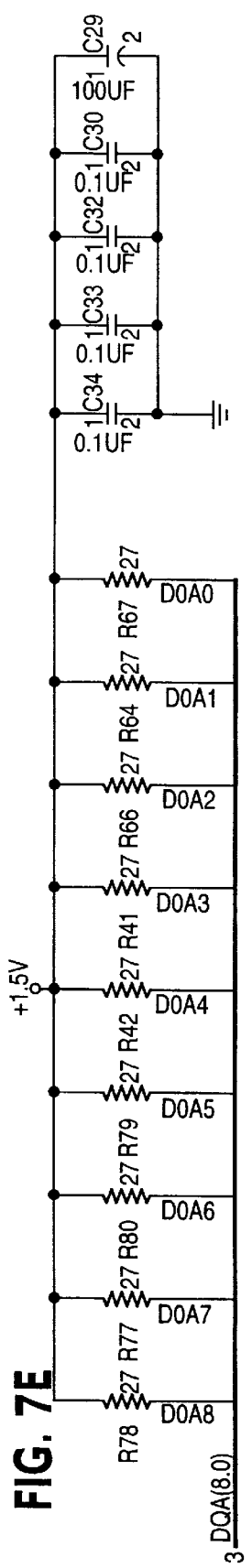
Figure 7F:
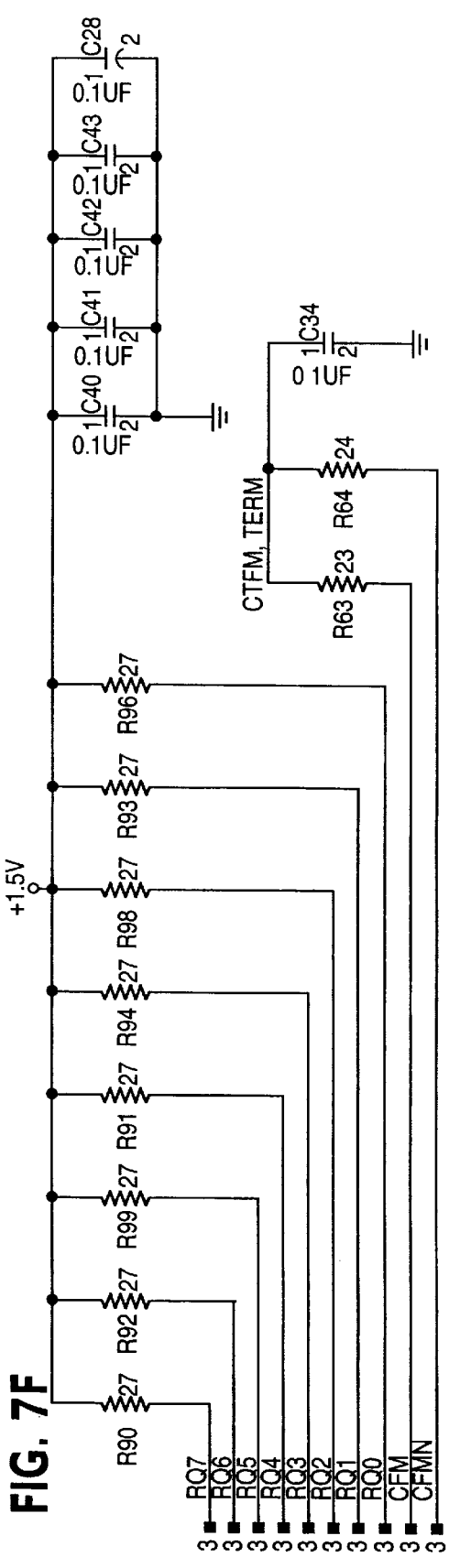

FIG. 3 is a schematic diagram illustrating the external connections of MRIMM 201 shown in FIG. 2. As explained, clock pins are not needed for clock signals to enter and exit the module. This allows the clock pinout to be reduced to approximately half that of the conventional RIMM module, and reduces signal reflections at the connector, and thereby reduces external effects on the clocks. The Rambus memory module 201 has only the 92 total pins listed in Table 1 below, yet still supports a plurality of 16-bit RDRAM devices. (The RDRAM devices may operate at 800 MHz or 600 MHz, and may have a capacity of 64 Mb, 128 Mb or 256 Mb.) FIGS. 6A and 6B are schematic diagrams illustrating the connections of the memory devices of RIMM 201 in the example embodiment of the invention shown in FIG. 2.

TABLE 1

| Pin | Pin Name | Pin | Pin Name |
|---|---|---|---|
| A1 | Gnd | B1 | Gnd |
| A2 | NC | B2 | LDQA7 |
| A3 | Gnd | B3 | Gnd |
| A4 | LDQA6 | B4 | LDQA5 |
| A5 | Gnd | B5 | Gnd |
| A6 | LDQA4 | B6 | LDQA3 |
| A7 | Gnd | B7 | Gnd |
| A8 | LDQA2 | B8 | LDQA1 |
| A9 | Gnd | B9 | Gnd |
| A10 | LDQA0 | B10 | LCFM |
| A11 | Gnd | B11 | Gnd |
| A12 | LCTMN | B12 | LCFMN |
| A13 | Gnd | B13 | Gnd |
| A14 | LCTM | B14 | NC |
| A15 | Gnd | B15 | Gnd |
| A16 | NC | B16 | LROW2 |
| A17 | Gnd | B17 | Gnd |
| A18 | LROW1 | B18 | LROW0 |
| A19 | Gnd | B19 | Gnd |
| A20 | LCOL4 | B20 | LCOL3 |
| A21 | Gnd | B21 | Gnd |
| A22 | LCOL2 | B22 | LCOL1 |
| A23 | Gnd | B23 | Gnd |
| A24 | LCOL0 | B24 | LDQB0 |
| A25 | Gnd | B25 | Gnd |
| A26 | LDQB1 | B26 | LDQB2 |
| A27 | Gnd | B27 | Gnd |
| A28 | LDQB3 | B28 | LDQB4 |
| A29 | Gnd | B29 | Gnd |
| A30 | LDQB5 | B30 | LDQB6 |
| A31 | Gnd | B31 | Gnd |
| A32 | LDQB7 | B32 | PWRDNB |
| A33 | Gnd | B33 | Gnd |
| A34 | LSCK | B34 | LCMD |
| A35 | VTERM(1.8) | B35 | VTERM(1.8) |

TABLE 1-continued

| Pin | Pin Name | Pin | Pin Name |
|---|---|---|---|
| A36 | SA2 | B36 | SIN |
| A37 | VTERM(1.8) | B37 | VTERM(1.8) |
| A38 | Gnd | B38 | Gnd |
| A39 | Gnd | B39 | Gnd |
| A40 | CLKN | B40 | CLKM |
| A41 | VDD(3.3) | B41 | VDD(3.3) |
| A42 | VDD(3.3) | B42 | VDD(3.3) |
| A43 | DRCG1 8 | B43 | DRCG3 3 |
| A44 | REFCLK | B44 | SWP |
| A45 | SPD3 3 | B45 | S0/S1 |
| A46 | SMBCLK | B46 | SMBDAT |

In addition to reducing the pin count for a smaller memory module, placing DRCG 205 and its associated components (decoupling, misc. discrete components) on RIMM 201 alleviates the problem of motherboard space constraints. The example embodiment also addresses the problem of RIMM form factor in the use of a graphics memory implementation. It is a smaller memory module for small form factor motherboards referred to hereafter as a Miniature RIMM ("MRIMM"). It is 35.0mm in height with an approximate weight of 30 grams (about ⅔ that of a standard RIMM module).

MRIMM 201 in the example embodiment of FIG. 2 is exemplarily a multi-layer printed circuit (PC) board connected to motherboard, or other board, 200 with a special connector. The PC board exemplarily has more layers than the board 200 (for example, eight) and a thickness of 1.27±0.10 mm (0.050±0.004 in) measured at the contact pads. The large number of layers facilitate the generation and distribution of clocking signals on MRIMM 201. Contact pad thickness is 0.75 microns (30 micro-inches) gold over a minimum of 2 microns (80 micro-inches) nickel. The connector pad descriptions are listed in Table 2. MRIMM 201 is optionally keyed for insertion orientation, safety, and configuration. The key is also used as a registration feature to endure proper mating of the module pads to the connector pads.

TABLE 2

| Signal | Module Connector Pads | I/O | Type | Description |
|---|---|---|---|---|
| Gnd | A1, A3, A5, A7, A9, A11, A13, A15, A17, A19, A21, A23, A25, A27, A29, A31, A33, A39, B1, B3, B5, B7, B9, B11, B13, B15, B17, B19, B21, B23, B25, B27, B29, B31, B39 | | | Ground reference for RDRAM* core and interface .35 PCB connector pads. |
| LCFM | B10 | I | RSL | Clock from master. Interface clock used for receiving RSL signals from the channel. Positive polarity. |
| LCFMN | B12 | I | RSL | Clock from master #. Interface clock used for receiving RSL signals from the channel. Negative polarity. |
| LCMD | B34 | I | Vcmos | Serial Command used to read from and write to the control registers. Also used for power management. |
| LCOL4 ... LCOL0 | A20, B20, A22, B22, A24 | I | RSL | Column bus. 5-bit bus containing control and address information for column accesses. |
| LCTM | A14 | I | RSL | Clock to master. Interface clock used for transmitting RSL signals to the channel. Positive polarity. |
| LCTMN | A12 | I | RSL | Clock to master #. Interface clock used for transmitting RSL signals to the channel. Negative polarity. |

TABLE 2-continued

| Signal | Module Connector Pads | I/O | Type | Description |
|---|---|---|---|---|
| LDQA7 ... LDQA0 | B2, A4, B4, A6, B6, A8, A10 | I/O | RSL | Data bus A. An 8-bit bus carrying a byte of read or write data between the channel and the RDRAM*. |
| LDQB7 ... LDQB0 | A32, B30, A30, B28, A28, B26, A26, B24 | I/O | RSL | Data bus B. An 8-bit bus carrying a byte of read or write data between the channel and the RDRAM*. |
| LROW2 ... LROW0 | B16, A18, B18 | I | RSL | Row bus. 3-bit bus containing control and address information for row accesses. |
| LSCK | A34 | I | V1.8 | Serial Clock Input. Clock source used to read from and write to the RDRAM* control registers. |
| NC | A16, B14, A2 | | | These pads are not connected. These 3 connector pads are reserved for future use. |
| SA2 | A36 | I | V3.3 | Serial Presence Detect Address 2. |
| SIN | B36 | I/O | V1.8 | Serial I/O for reading from and writing to the control registers. Attaches to SIO0 of the first RDRAM* on the module. |
| SPD3_3 | A45 | I | V3.3 | SPD Voltage. Used for signals SMBCLK, SMBDAT, SWP, SA0 and SA1. |
| SWP | B44 | I | V3.3 | Serial Presence Detect Write Protect (active high). When low, the SPD can be written as well as read. |
| VTERM | A35, B35, A37, B37 | I | V1.8 | RSL Termination Voltage. |
| VDD | A41, A42, B41, B42 | I | V3.3 | Supply voltage for the RDRAM* core and interface logic. |
| PWRDNB | A32 | I | | Powerdown B. Signal to enter power management mode to DRCG. |
| REFCLK | A44 | I | CLK | Reference Clock into DRCG |
| DRCG1 8 | A43 | I | V1.8 | DRCG voltage. |
| DRCG3 3 | B43 | I | V3.3 | DRCG voltage. |
| S0/S1 | B45 | I | | TEST MODE |

Maximum warpage of the PC board comprising MRIMM 201 is 1% (0. 01 mm per mm). Impedance for the loaded and unloaded sections of all critical signal traces on MRIMM 201 are at 28 ohm +/−10%. The critical signals include the RSL signals, two high-speed CMOS signals (LSCK and LCMD) and the clock signals.

Figure 4:
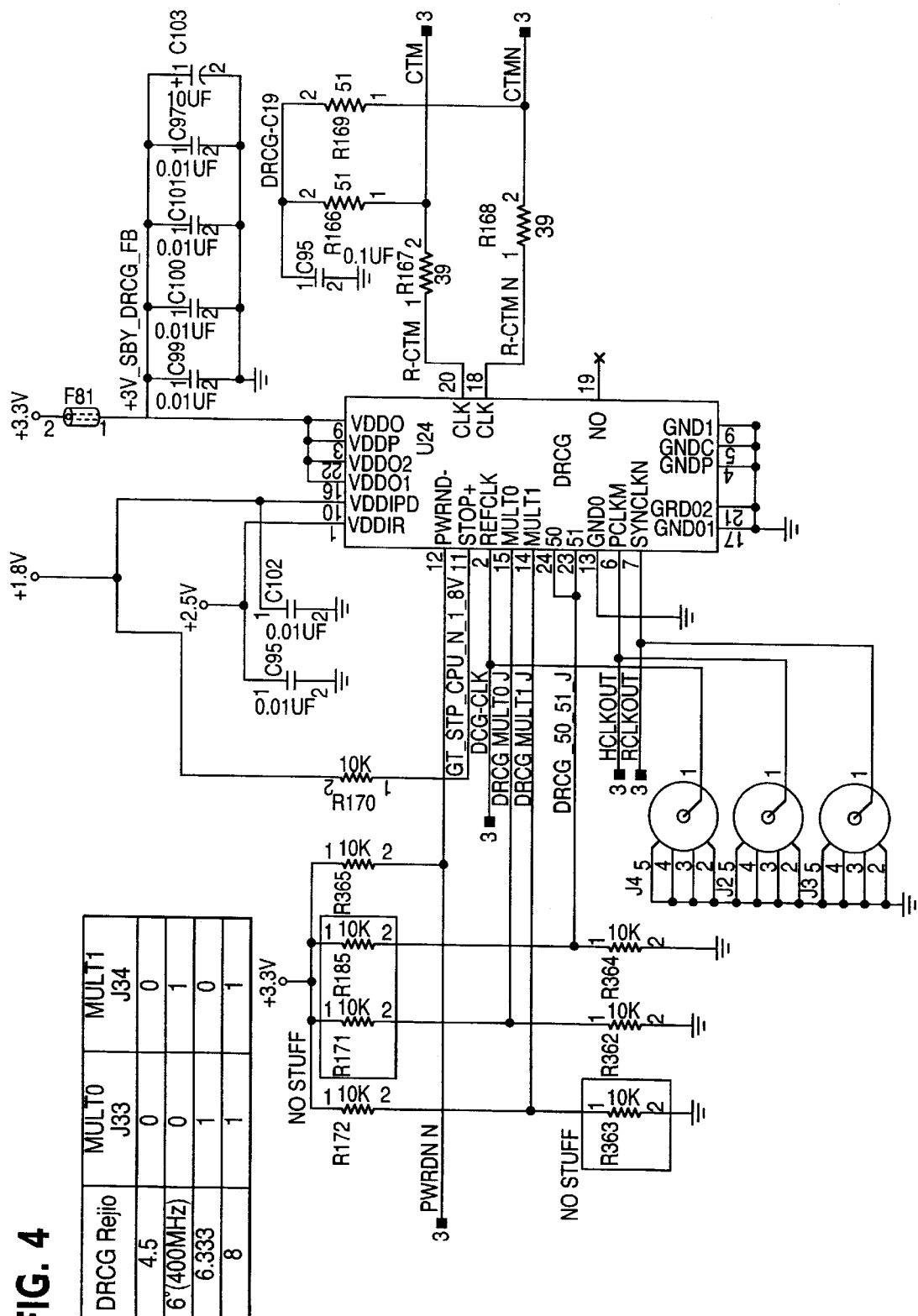
FIG. 4 is a schematic diagram illustrating the connections of a Direct Rambus Clock Generator (DRCG) in the example embodiment of the invention shown in FIG. 2.

DRCG 205 may supply a 300 or 400 MHz differential clock signal pair to support the Direct Rambus memory subsystem composed of RDRAM memory devices 101-1. It includes signals to synchronize the Direct Rambus Channel clock to an external system clock. Control and data signals are clocked on both edges of the clock resulting in an 600 or 800 MHz effective transfer. Power consumption for DRCG 205 is less than 350 mW with Vdd=3.3V±5%. FIG. 4 is a schematic diagram illustrating the connections of Direct Rambus Clock Generator (DRCG) 205 in the example embodiment of the invention shown in FIG. 2.

Although not shown in FIG. 2, MCH 204 is preferably an integrated circuit chip or chipset including a graphics controller and MRIMM 201 is used as graphics memory controlled by the graphics controller of MCH 204. In addition to supporting MRIMM 201 as graphics memory, MCH 204 also supports a front side bus to a processor and a memory interface to main memory (which may be SDRAM or DDR SDRAM instead of RDRAM). MCH 204 may constitute the North Bridge of a chipset with a bus connection to a South Bridge I/O Controller Hub. In particular, MCH 204 may be part of a chipset in the 82xxx family of chipsets available from Intel Corporation.

The S0 and S1 lines on DRCG 205 are tied together to allow only two modes of clock operation: Normal Mode and Test Mode. In Normal Mode, the S0 and S1 lines contain a logical 0 and the Clk and ClkB outputs run at the Rambus channel operating frequency (such as 300 MHz or 400 MHz) determined by REFCLK and multiplier set by additional input pins on the DRCG. If the S0 and S1 lines are asserted logical 1, Test Mode is assumed and the Clk and ClkB outputs are RefClk and RefClkB.

As stated above, voltage termination for RIMM memory modules is conventionally done on the motherboard, but is done on MRIMM 201 itself in the example embodiment of FIG. 2. All signals are properly terminated to 1.8V using 27–2% or 28–1% resistors. Additionally, Vterm must be decoupled using one 0.1F high speed bypass capacitor for every two RSL lines.

Bulk capacitance is also required. Assuming a linear regulator with an approximately 20 ms response time, two 100-F tantalum capacitors are preferred. Signal drivers are electrically "Open Drain" in current source mode, which means that signals are asserted electrically low. All signals swing uniformly between 1.8V and 1.0V. The reference voltage (1.4V) provides a reference to comparators present on all inputs. When a signal is at 1.0V it is considered to be at Logical 1. These signaling levels are RSL.

A 2.5V power supply needs to be established before the 1.8V in a power sequencing procedure. If the 1.8V comes up before the 2.5V is established, damage to the module may occur. The 2.5V supply is preferably provided by a Semtech SC1565 2.5V voltage regulator. FIGS. 7A—7F are schematic diagrams of the voltage termination and regulation circuits in the example embodiment of the invention shown in FIG. 2.

The SPD EEPROM 207 is preferably implemented using a 2048 bit EEPROM component such as the National NM24C02L, Catalyst CAT24WC02, SGS Thompson (now ST Microelectronics) 24C02 or equivalent. SPD EEPROM 207 must operate with a positive power supply in the range of 2.2 to 3.6V and all input or output voltage with respect to ground must be in the range of 4.6 to −0.3V.

Figure 5:
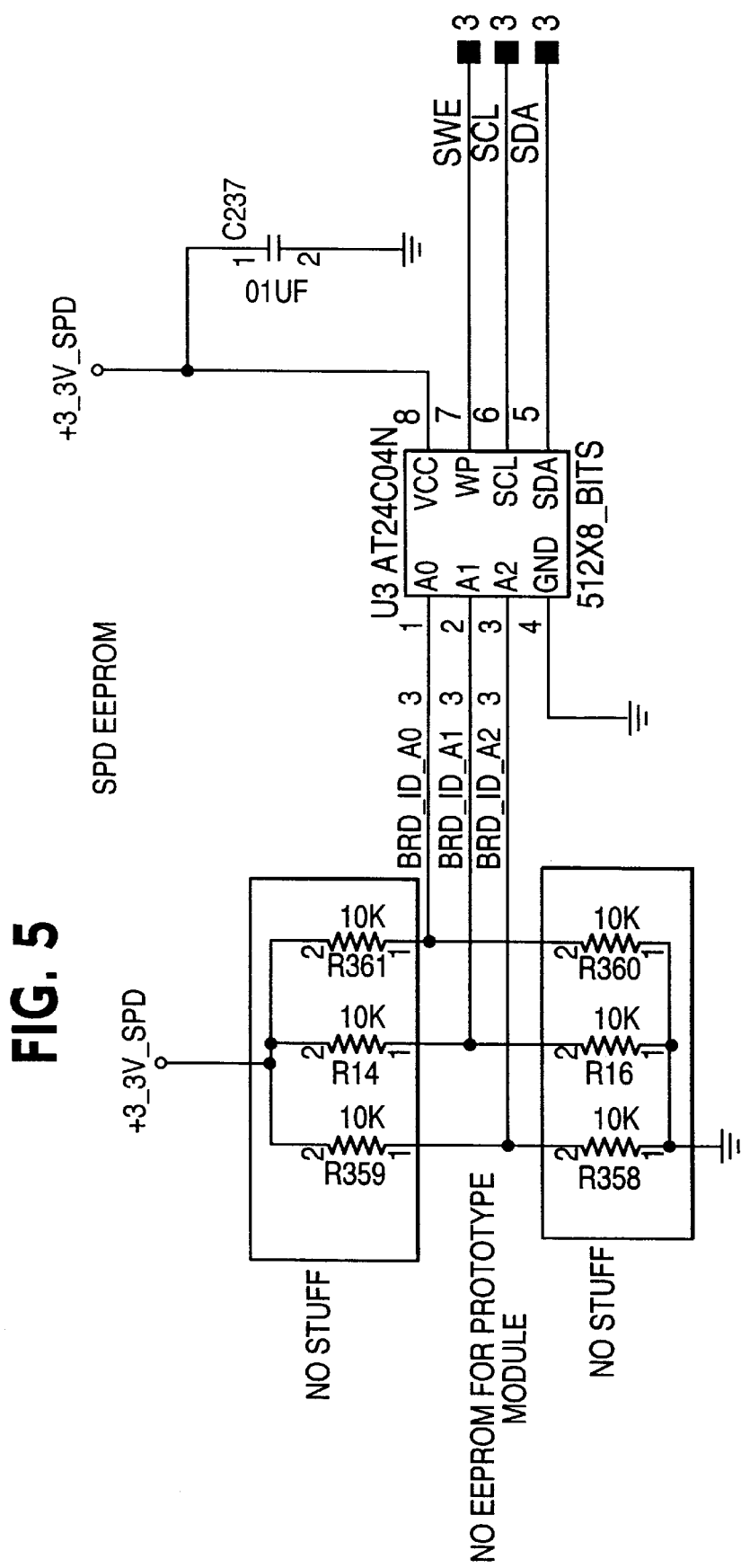
FIG. 5 is a schematic diagram illustrating the connections of a serial presence detect electrically erasable programmable read-only memory (SPD EEPROM) in the example embodiment of the invention shown in FIG. 2.

FIG. 5 is a schematic diagram illustrating the connections of SPD EEPROM 207 in the example embodiment of the invention shown in FIG. 2. To ensure that MRIMM 201 has a unique address, the SA2 signal is brought down to motherboard 200 while the SA1 and SA0 signals of SPD EEPROM 207 are tied to Vcc. The SA2 signal controls the two addressing modes. When the SA2 signal is low, the address is A6. When the SA2 signal is high, the address is AE.

An advantage of the example embodiment comes from the use of RDRAM™ memory devices. While these devices have high performance, the Rambus channel interconnect technology for the devices only have 8, 9, 16 or 18 bits. The example embodiments according to the invention allow a Rambus memory module to utilize Rambus devices of 16-bit widths to obtain the high performance characteristics thereof while maintaining efficiency in size.

Of course, the example embodiments of the invention are not limited to personal computers. Indeed, the invention is particularly useful for any computing device employing the high memory performance of Rambus. The invention may be used in any device in which a high degree of data storage and size efficiency is desired.

Other features of the invention may be apparent to those skilled in the art from the detailed description of the exemplary embodiments and claims when read in connection with the accompanying drawings. While the foregoing and following written and illustrated disclosure focuses on disclosing exemplary embodiments of the invention, it should be understood that the same is by way of illustration and example only, is not to be taken by way of limitation and may be modified in learned practice of the invention. While the foregoing has described what are considered to be exemplary embodiments of the invention, it is understood that various modifications may be made therein and that the invention may be implemented in various forms and embodiments, and that it may be applied in numerous applications, only some of which have been described herein. It is intended by the following claims to claim all such modifications and variations.

What is claimed is:

1. A memory module comprising:
   at least one memory device;
   a clock generator providing clocking signals; and
   a clocking topology which connects said clocking signals to said at least one memory device.

2. The memory module recited in claim 1, wherein the clocking topology begins and ends on the memory module.

3. The memory module recited in claim 1, wherein the memory module is a Miniature Rambus In-line Memory Module (MRIMM).

4. The memory module recited in claim 3, wherein the MRIMM has no more than 92 connector pins.

5. The memory module recited in claim 4, wherein the clock generator is a Direct Rambus Clock Generator (DRCG) and two signal lines on the DRCG are tied together to allow only two modes of operation.

6. The memory module recited in claim 5, wherein said two modes of operation comprise a Normal Mode and a Test Mode.

7. The memory module recited in claim 3, wherein said memory module further comprises a Serial Presence Detect Electrically Erasable Programmable Read-Only Memory (SPD EEPROM).

8. The memory module recited in claim 1, wherein the memory module comprises a multi-layer printed circuit board.

9. A computer system comprising:
   a processor;
   a memory controller hub connected to said processor and including a graphics controller; and
   a memory module connected to said memory controller hub, utilized as graphics memory and controlled by said graphics controller included in said memory controller hub, said memory module comprising:
   at least one memory device;
   a clock generator providing clocking signals; and
   a clocking topology connecting said clocking signals to said at least one memory device.

10. The computer system recited in claim 9, wherein the clocking topology begins and ends on the memory module.

11. The computer system recited in claim 9, wherein the memory module is a Miniature Rambus In-line Memory Module (MRIMM).

12. The computer system recited in claim 11, wherein the MRIMM has no more than 92 connector pins.

13. The computer system recited in claim 11, wherein the clock generator is a Direct Rambus Clock Generator (DRCG) and two signal lines on the DRCG are tied together to allow only two modes of operation.

14. The computer system recited in claim 13, wherein said two modes of operation comprise a Normal Mode and a Test Mode.

15. The computer system recited in claim 11, wherein said memory module further comprises a Serial Presence Detect Electrically Erasable Programmable Read-only Memory (SPD EEPROM).

16. The computer system recited in claim 9, wherein the memory module comprises a multi-layer printed circuit board.

17. The computer system recited in claim 9, wherein said memory controller hub is mounted on a motherboard and said memory module connects to said memory controller hub via a connector on said motherboard.

* * * * *